United States Patent
Nagaya et al.

(10) Patent No.: US 9,781,840 B2
(45) Date of Patent: Oct. 3, 2017

(54) SUBSTRATE FOR MOUNTING ELECTRONIC COMPONENT AND METHOD FOR MANUFACTURING THE SAME

(71) Applicant: IBIDEN CO., LTD., Ogaki-shi (JP)

(72) Inventors: Naoyuki Nagaya, Ibi-gun (JP); Kiyotaka Tsukada, Ibi-gun (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/938,191

(22) Filed: Nov. 11, 2015

(65) Prior Publication Data

US 2016/0135302 A1   May 12, 2016

(30) Foreign Application Priority Data

Nov. 11, 2014 (JP) ................. 2014-229031

(51) Int. Cl.
- *H05K 1/03* (2006.01)
- *H05K 3/34* (2006.01)
- *H05K 1/02* (2006.01)
- *H05K 3/00* (2006.01)

(52) U.S. Cl.
CPC .......... *H05K 3/341* (2013.01); *H05K 1/0206* (2013.01); *H05K 3/005* (2013.01); *H05K 2201/091* (2013.01); *H05K 2201/09072* (2013.01); *H05K 2201/10106* (2013.01); *H05K 2201/10416* (2013.01); *Y02P 70/613* (2015.11)

(58) Field of Classification Search
CPC ...... H05K 3/341; H05K 1/0206; H05K 3/005; H05K 2201/09072; H05K 2201/091; Y02P 70/613
USPC ........ 174/255, 250, 251, 256–258, 261, 262
See application file for complete search history.

(56) References Cited

FOREIGN PATENT DOCUMENTS

JP       2014-135306 A      7/2014

*Primary Examiner* — Tremesha S Willis
(74) *Attorney, Agent, or Firm* — Oblon, McClelland, Maier & Neustadt, L.L.P.

(57) ABSTRACT

A substrate for mounting an electronic component includes a base material including insulating resin, a first conductor layer formed on first surface of the material, a second conductor layer formed on second surface of the material, and a metal block inserted into a hole penetrating through the first conductor, material and second conductor such that the metal block is fitted in the hole. The material has a bent portion in contact with the metal block in the hole such that the bent portion is bending toward the second conductor, the metal block has surface on first conductor side such that the surface has an outer peripheral portion having a curved-surface shape, and the hole has a first fitting inlet on the first conductor layer side and a second fitting inlet on second conductor side and that the metal block is positioned in contact with the second fitting inlet.

20 Claims, 8 Drawing Sheets

SUBSTRATE FOR MOUNTING ELECTRONIC COMPONENT AND METHOD FOR MANUFACTURING THE SAME

CROSS-REFERENCE TO RELATED APPLICATIONS

The present application is based upon and claims the benefit of priority to Japanese Patent Application No. 2014-229031, filed Nov. 11, 2014, the entire contents of which are incorporated herein by reference.

BACKGROUND OF THE INVENTION

Field of the Invention

The present invention relates to a substrate for mounting an electronic component and a method for manufacturing a substrate for mounting an electronic component.

Description of Background Art

Japanese Patent Laid-Open Publication No. 2014-135306 describes a light-emitting element mounting substrate which has an element mounting surface for mounting a surface-emitting type light-emitting element, and a reflector surface that reflects light emitted by the light-emitting element. The light-emitting element mounting substrate of Japanese Patent Laid-Open Publication No. 2014-135306 has the metal block that penetrates a base material. The entire contents of this publication are incorporated herein by reference.

SUMMARY OF THE INVENTION

According to one aspect of the present invention, a substrate for mounting an electronic component includes a base material including an insulating resin material, a first conductor layer formed on a first surface of the base material, a second conductor layer formed on a second surface of the base material on the opposite side with respect to the first surface of the base material, and a metal block inserted into a hole penetrating through the first conductor layer, the base material and the second conductor layer such that the metal block is fitted in the hole. The base material has a bent portion in contact with the metal block in the hole such that the bent portion is bending toward the second conductor layer, the metal block has a surface on a first conductor layer side such that the surface has an outer peripheral portion having a curved-surface shape, and the hole is formed such that the hole has a first fitting inlet on the first conductor layer side and a second fitting inlet on a second conductor layer side and that the metal block is positioned in contact with the second fitting inlet.

According to another aspect of the present invention, a method for manufacturing a substrate for mounting an electronic component includes forming a double-sided conductor substrate including a base material including an insulating resin material, a first conductor layer formed on a first surface of the base material and a second conductor layer formed on a second surface of the base material on the opposite side with respect to the first surface, punching a hole from the first conductor layer such that the hole is formed to penetrate through the first conductor layer, the base material and the second conductor layer and that the base material forms a bent portion bending toward the second conductor layer, and inserting a metal block into the hole from a second conductor layer side such that the metal block is fitted into the hole and that the bent portion of the base material is positioned in contact with the metal block.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

Figure 1:
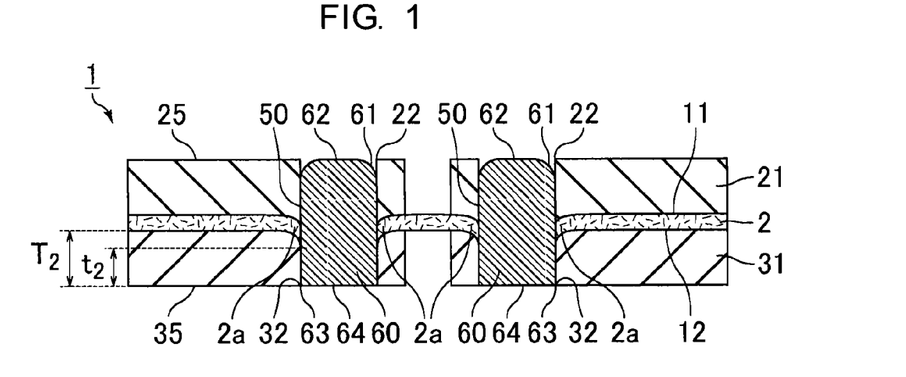
FIG. 1 is a cross-sectional view schematically illustrating a substrate for mounting an electronic component according to an embodiment of the present invention.

FIG. 1 is a cross-sectional view schematically illustrating a substrate for mounting an electronic component according to an embodiment of the present invention.

The substrate for mounting an electronic component illustrated in FIG. 1 is a substrate that does not include a light-reflecting layer (to be described later).

As illustrated in FIG. 1, a substrate 1 for mounting an electronic component includes a base material 2 that is formed from an insulating resin and has a first main surface 11 and a second main surface 12 (that is on an opposite side of the first main surface 11), a first conductor layer 21 that is formed on the first main surface 11 of the base material 2, and a second conductor layer 31 that is formed on the second main surface 12 of the base material 2.

The insulating resin that forms the base material 2 is not particularly limited. However, it is preferable that the insulating resin be a flexible insulating resin. Examples of a material that forms such an insulating resin include polyimide, glass epoxy and the like. Among these, polyimide is preferred. When the insulating resin is polyimide, the insulating resin is both flexible and insulating. Therefore, while ensuring sufficient insulation, a shape can be deformed according to intended use.

A thickness of the base material 2 is not particularly limited. However, it is preferable that the thickness of the base material 2 be 30-70 µm. When the thickness of the base material 2 is smaller than 30 µm, the base material 2 easily bends. Further, since the base material easily bends, bonding with a wiring or an electronic component can be easily broken. Further, when the thickness of the base material 2 is more than 70 µm, when a bent part is formed by punching, a crack is likely to occur around a penetrating bent part, which may decrease reliability.

A material that forms the first conductor layer 21 and the second conductor layer 31 is not particularly limited. However, it is preferable that the material be copper, nickel or the like.

These materials have good electrical conductivity and are suitable as conductors.

The first conductor layer 21 and the second conductor layer 31 are not particularly limited in thickness. However, it is preferable that the first conductor layer 21 and the second conductor layer 31 be each thicker than the base material 2. Further, it is preferable that the first conductor layer 21 and the second conductor layer 31 each have a thickness of 10-300 µm. When the thickness of each of the first conductor layer 21 and the second conductor layer 31 is smaller than 10 µm, during handling, the conductor layers easily break and failure rate is increased. Further, when the thickness of each of the first conductor layer 21 and the second conductor layer 31 is larger than 300 µm, when the substrate for mounting an electronic component is bent and used, due to the bending, a large compressive stress is applied from the conductor layers to the base material and thus the base material is likely to be broken.

As illustrated in FIG. 1, the substrate 1 for mounting an electronic component further includes a hole 50 that penetrates the first conductor layer 21, the base material 2 and the second conductor layer 31, and a metal block 60 that is fitted into the hole 50.

The metal block 60 is different from a filled via that is formed in a through hole through a chemical process such as plating. There are no voids formed inside the metal block 60 and there is no concave or convex portion or the like on a surface of the metal block 60. Since there are no voids formed inside the metal block 60, heat-transfer efficiency of the metal block 60 is not reduced, and heat dissipation performance of the metal block 60 can be ensured.

A material that forms the metal block 60 is not particularly limited. However, it is preferable that the material be copper that is excellent in electrical conductivity and thermal conductivity.

Further, the metal block 60 is not particularly limited in shape. However, it is preferable that the metal block 60 have a shape of a column having a flat bottom surface. Examples of such a shape include shapes of a circular column, a quadrangular, a hexagonal column, an octagonal column and the like.

The metal block 60 have the basic structures that are as described above, and further have the following structures.

The base material 2 has a bent part (2a) that bends toward the second conductor layer 31 side and is in contact with the metal block 60.

Although the bent part (2a) bends toward the second conductor layer 31 side, a degree of the bending is small so that the bent part (2a) does not reach the surface of the substrate for mounting an electronic component and does not interfere with conduction between the metal block 60 and the second conductor layer 31.

A portion of the second conductor layer 31, where the bent part (2a) of the base material 2 is formed, has a thickness (indicated by a double-headed arrow ($t_2$) in FIG. 1). The thickness of this portion is smaller than a thickness of the other portion of the second conductor layer 31 (the thickness indicated by a double-headed arrow ($T_2$) in FIG. 1).

A second fitting inlet 32, which is an inlet of the hole 50 on the second conductor layer 31 side, and the metal block 60 are in contact with each other. The second fitting inlet 32 can be considered as a part of the second conductor layer 31. Therefore, that the metal block 60 is in contact with the second fitting inlet 32 means that the metal block 60 and the second conductor layer 31 are in contact with each other and conduction between the metal block 60 and the second conductor layer 31 is in a state of being satisfactorily ensured.

Further, it is preferable that the metal block 60 be also electrically connected to the first conductor layer 21.

An outer peripheral portion 63 of the surface of the metal block 60 on the second conductor layer 31 side is not in a curved-surface shape. Further, a front end portion 64 of the surface of the metal block 60 on the second conductor layer 31 side is a flat surface.

That is, the entire surface of the metal block 60 on the second conductor layer 31 side is a flat surface.

Further, the front end portion 64 of the surface of the metal block 60 on the second conductor layer 31 side and a surface 35 of the second conductor layer 31 form the same plane.

An outer peripheral portion 61 of a surface of the metal block 60 on the first conductor layer 21 side is in a curved-surface shape.

On the other hand, an inlet of the hole 50 on the first conductor layer 21 side is a first fitting inlet 22.

Here, with regard to a positional relation between the metal block 60 and the hole 50 on the first conductor layer 21 side, a recess (interspace) occurs between the first fitting inlet 22 of the hole 50 and the outer peripheral portion 61 of the metal block 60.

When such a recess occurs, when an electronic component is mounted, even when the electronic component causes lateral displacement, the electronic component is caught by the recess. Therefore, without having a large displacement, conduction between the electronic component and the substrate can be ensured.

Further, a front end portion 62 of the surface of the metal block 60 on the first conductor layer 21 side is a flat surface.

When the front end portion of the surface on the first conductor layer side is a flat surface, an electronic component that is mounted when the front end portion is used as a pad can be prevented from being inclined.

Further, the front end portion 62 of the surface of the metal block 60 on the first conductor layer 21 side and a surface 25 of the first conductor layer 21 form the same plane. When the front end portion 62 and the surface 25 are on the same plane, lateral displacement of the electronic component during mounting can be suppressed and mounting accuracy can be improved.

The front end portion 62 of the surface of the metal block 60 on the first conductor layer 21 side can be used as a mounting pad for an electronic component such as a light-emitting element, and an electrode of the electronic component can be positioned on the front end portion 62.

When a surface of the metal block is used as a mounting pad, the surface of the metal block may be used as an outermost surface of the mounting pad, and it is also possible to have a mounting pad that is formed by forming a conductor layer on the surface of the metal block by metal plating and gold plating.

A structure of the mounting pad that is formed by forming a conductor layer on the surface of the metal block will be described later.

Metal blocks 60 that each have a front end portion 62 of a surface on the first conductor layer 21 side respectively exist at multiple places in the same substrate. In FIG. 1, two metal blocks are illustrated, and two front end portions 62 of the surfaces of the two metal blocks 60 on the first conductor layer 21 side are illustrated at two places.

It is preferable that a coplanarity of a virtual plane that is formed by the front end portions of the surfaces on the first conductor layer side that exist at multiple places in the same substrate surface be 3-20 μm. In a case where the coplanarity is smaller than 3 μm, when a light-emitting element is mounted and is caused to emit light, diffuse reflection becomes insufficient. Further, in a case where the coplanarity is larger than 20 μm, when an electronic component is mounted, the electronic component becomes inclined and mounting failure occurs.

The coplanarity of the virtual plane is determined as a difference between a maximum value and a minimum value of heights of the front end portions of the surfaces of the metal blocks on the first conductor layer side when the heights of the front end portions of the surfaces of the metal blocks on the first conductor layer side are measured by placing the substrate for mounting an electronic component on a horizontal surface.

The measurement of the heights of the front end portions of the surfaces of the metal blocks on the first conductor layer side can be performed using a three-dimensional shape measuring device or the like.

Further, when a conductor layer is formed on the surface of the metal block, the coplanarity of the virtual plane is calculated by measuring a height of an outermost surface of the conductor layer (outermost surface of a mounting pad) as the height of the front end portion of the surface of the metal block on the first conductor layer side.

That the above-described coplanarity is in such a range means that the heights of the mounting pads in the substrate is uniform. Therefore, when a light-emitting element is mounted to the substrate for mounting an electronic component, all of the mounting pads are connected to electrodes of the light-emitting element. Therefore, a connection failure is prevented. Further, inclination of the mounted light-emitting element does not occur. Therefore, a problem that an optical axis of the light-emitting element inclines also does not occur.

Figure 2:
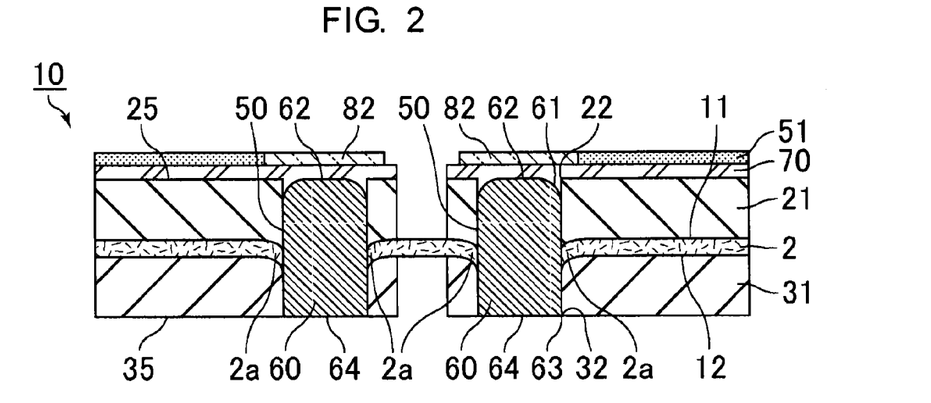
FIG. 2 is a cross-sectional view schematically illustrating an example of a substrate for mounting an electronic component, in which a metal plating layer, a gold plating layer and a light-reflecting layer are provided.

FIG. 2 is a cross-sectional view schematically illustrating an example of a substrate for mounting an electronic component, in which a metal plating layer, a gold plating layer and a light-reflecting layer are provided.

A substrate 10 for mounting an electronic component illustrated in FIG. 2 is a substrate obtained by providing a metal plating layer 70, a gold plating layer 82 and a light-reflecting layer 51 on the first conductor layer 21 side of a substrate 1 for mounting an electronic component according to an embodiment of the present invention illustrated in FIG. 1. The substrate 10 for mounting an electronic component is also a substrate for mounting an electronic component according to an embodiment of the present invention.

In the substrate 10 for mounting an electronic component, the metal plating layer 70 is formed on the surface of the metal block 60 on the first conductor layer 21 side and on the surface 25 of the first conductor layer 21.

When the metal plating layer 70 is formed, the surface of the metal block 60 on the first conductor layer 21 side and the surface 25 of the first conductor layer 21 are protected by the metal plating layer 70, and the metal block 60 and the first conductor layer 21 can be protected from corrosion.

Further, it is preferable that the metal plating layer 70 be formed so as to cover the surface of the metal block 60 on the first conductor layer 21 side and the surface 25 of the first conductor layer 21.

The metal block 60, although being inserted and fitted into the hole 50, may pop out from the hole 50 due to an impact or the like.

However, when the metal plating layer 70 is formed so as to cover the surface of the metal block 60 on the first conductor layer 21 side and the surface 25 of the first conductor layer 21, the metal plating layer 70 fixes the metal block 60, and it is possible to make the metal block 60 less likely to pop out from the hole 50.

It is preferable that the metal plating layer 70 be formed from at least one metal selected from a group of nickel and silver.

When the metal plating layer 70 is formed from these metals, an effect due to the existence of the metal plating layer 70 can be suitably achieved.

A thickness of the metal plating layer 70 is not particularly limited. However, it is preferable that the thickness of the metal plating layer 70 be 1.0-10 μm.

When the thickness of the metal plating layer is smaller than 1.0 μm, during handling, the conductor layers easily break and failure rate is increased. Further, when the thickness of the metal plating layer is larger than 10 μm, when the substrate for mounting an electronic component is bent and used, due to the bending, a large compressive stress is applied from the metal plating layer and the conductor layers to the base material and thus the base material is likely to be broken.

Further, in the substrate 10 for mounting an electronic component, the metal plating layer 70 is formed on the surface of the metal block 60 on the first conductor layer 21 and on the surface 25 of the first conductor layer 21 so as to connect the outer peripheral portion 61 of the surface of the metal block 60 on the first conductor layer 21 side and the first fitting inlet 22.

In the substrate 10 for mounting an electronic component, the gold plating layer 82 as a gold layer is provided on the metal plating layer 70 in a portion that becomes a mounting pad on the front end portion 62 of the surface of the metal block 60 on the first conductor layer 21 side.

When the outermost surface of the mounting pad is a gold plating layer, gold can prevent oxidation of the metal plating layer.

A thickness of the gold layer is not particularly limited. However, it is preferable that the thickness of the gold layer be 0.5-3.0 μm.

Further, it is also possible that a tin layer may be formed instead of the gold layer.

When the thickness of the gold layer or the tin layer is smaller than 0.5 μm, since the thickness is too thin, oxidation of the metal plating layer cannot be prevented. Further, since gold and tin are soft metals, the gold layer or the tin layer is likely to deform. Therefore, when the thickness of the gold layer or the tin layer is larger than 3.0 µm, when the gold layer or the tin layer deforms, the gold layer or the tin layer spreads to surrounding areas and generates a compressive stress, which can become a reason for a failure such as peeling.

Further, the substrate 10 for mounting an electronic component includes the light-reflecting layer 51 on the outermost surface on the first conductor layer side.

In the substrate for mounting an electronic component, the portion where the gold plating layer 82 is formed is a mounting pad. An electronic component is mounted on the mounting pad. Therefore, this portion becomes an element mounting part.

The light-reflecting layer 51 is provided such that the gold plating layer 82 that is the element mounting part is exposed.

Further, a material that forms the light-reflecting layer 51 is not particularly limited. However, it is preferable that the light-reflecting layer 51 be an insulating layer containing titanium oxide as a pigment. It is more preferable that the light-reflecting layer 51 be a solder resist layer containing titanium oxide as a pigment.

Titanium oxide is a white pigment. The light-reflecting layer 51 containing titanium oxide can suitably reflect light. Therefore, an effect due to the existence of the light-reflecting layer 51 can be suitably achieved.

Further, when the light-reflecting layer 51 is a solder resist layer containing titanium oxide as a pigment, in addition to the above effect, the light-reflecting layer 51 also functions as a solder resist at the same time.

A thickness of the light-reflecting layer 51 is not particularly limited. However, it is preferable that the thickness of the light-reflecting layer 51 be two to ten times a thickness of an electronic component such as a light-emitting element. It is preferable that a specific value of the thickness of the light-reflecting layer 51 be 50-300 µm. When the thickness of the light-reflecting layer is smaller than 50 µm, a crack or a defect may occur due to progress in deterioration due to heat generated from an electronic component. Further, when the thickness of the light-reflecting layer is larger than 300 µm, when the substrate is used by bending the substrate, the light-reflecting layer may not be able to follow the bending and a crack may occur.

Figure 3:
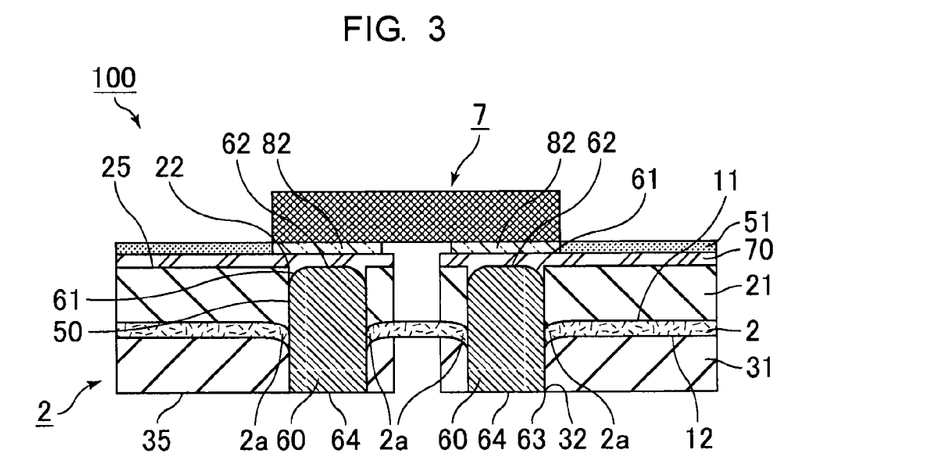
FIG. 3 is a cross-sectional view schematically illustrating a light-emitting device in which a light-emitting element is mounted on a substrate for mounting an electronic component according to an embodiment of the present invention.

FIG. 3 is a cross-sectional view schematically illustrating a light-emitting device in which a light-emitting element is mounted on a substrate for mounting an electronic component according to an embodiment of the present invention.

FIG. 3 illustrates a light-emitting device 100 in which a light-emitting element 7 is mounted on the substrate 10 for mounting an electronic component illustrated in FIG. 2.

As the light-emitting element 7, an LED (light-emitting diode) element or an LD (laser diode) can be used. It is preferable that the light-emitting element be a surface-mounting type element.

Surface-mounting type light-emitting elements can be mounted in an increased mounting density. Therefore, when multiple light-emitting elements are mounted in the substrate for mounting an electronic component, luminance of light emitted from the light-emitting device can be increased.

Electrodes of the light-emitting element 7 are each electrically connected to a mounting pad that is formed by forming the gold plating layer 82 on the outermost surface. It is preferable that an outermost surface of each of the electrodes of the light-emitting element be a gold layer or a tin layer.

A method for connecting the electrodes of the light-emitting element and the mounting pads is not particularly limited. For example, the electrodes and the mounting pads can be connected using solder (not illustrated in the drawings).

In the case where an outermost surface of a mounting pad is formed of a gold plating layer, when a tin layer is formed on a surface of an electrode of the light-emitting element, the light-emitting element and the mounting pad can be connected by eutectic connection of gold and tin.

The electronic component that is mounted to a substrate for mounting an electronic component according to an embodiment of the present invention is not limited to a light-emitting element, but may also be a transistor, a capacitor, an IC chip, or the like. It is preferable that these electronic components be also of the surface-mounting type.

Figure 4:
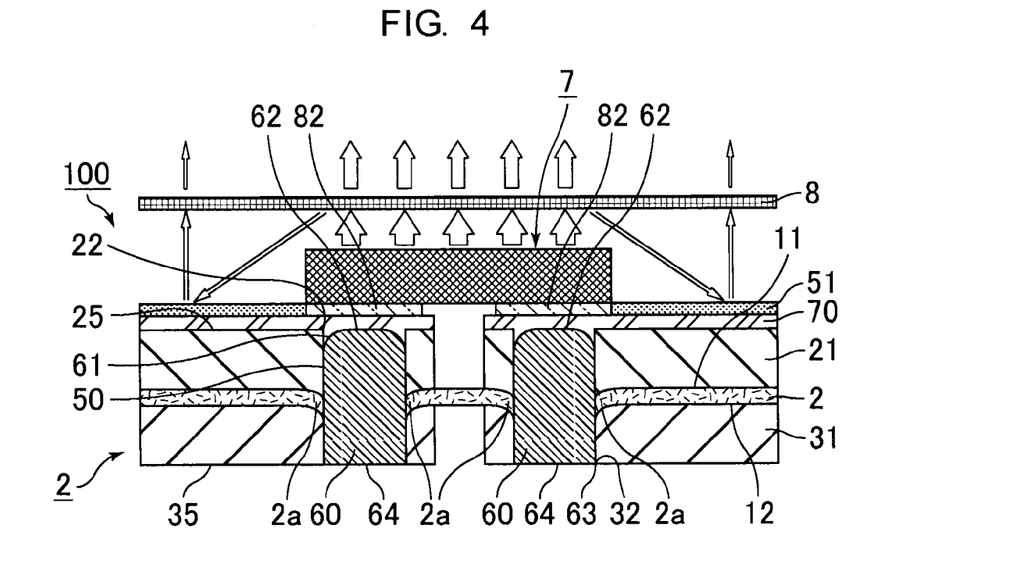
FIG. 4 schematically describes an effect of the light-reflecting layer.

FIG. 4 schematically describes an effect of the light-reflecting layer.

The light-emitting device 100 in which the light-emitting element 7 is mounted on the substrate 10 for mounting an electronic component is covered by a transparent cover 8 for a purpose of protecting the light-emitting device.

As illustrated in FIG. 4, in the light-emitting device 100 having the light-reflecting layer 51, when the light-emitting element 7 emits light, most of the light transmits through the cover 8. However, a portion of the light is reflected by the cover 8 (in FIG. 4, directions of arrows indicate directions along which light propagates, and a thickness of each of the arrows indicates an amount of light). When the light-reflecting layer is formed in the substrate for mounting an electronic component, the reflected light can be re-reflected. Therefore, luminance can be increased.

A material that forms the cover 8 is not particularly limited. However, it is preferable that the material be acrylic resin (PMMA), polycarbonate (PC), glass, or the like.

Figure 5:
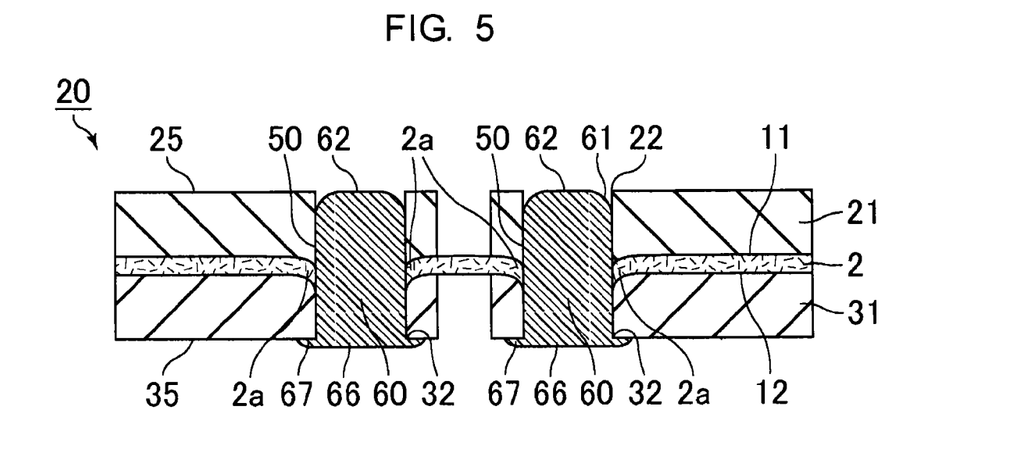
FIG. 5 is a cross-sectional view schematically illustrating a substrate for mounting an electronic component according to another embodiment of the present invention.

FIG. 5 is a cross-sectional view schematically illustrating a substrate for mounting an electronic component according to another embodiment of the present invention.

In a substrate 20 for mounting an electronic component illustrated in FIG. 5, the metal block 60 has a second protruding portion 66 that protrudes from the surface of the second conductor layer 31. The second protruding portion 66 has a second extending portion 67 that spreads so as to cover a surrounding area of the second fitting inlet 32.

Other structures of the substrate 20 for mounting an electronic component are the same as the substrate 1 for mounting an electronic component illustrated in FIG. 1, and thus a detailed description thereof is omitted.

In this way, when the second extending portion 67 is formed, the second extending portion 67 functions as an anchor that prevents the metal block 60 from being separated and falling out from the substrate 20 for mounting an electronic component. Therefore, when the substrate 20 for mounting an electronic component is bent, the metal block 60 can be prevented from being separated and falling out from the first conductor layer 21 side.

Next, a light-emitting element module is described that uses the light-emitting device in which a light-emitting element is mounted on a substrate for mounting an electronic component according to an embodiment of the present invention.

Figure 6A:
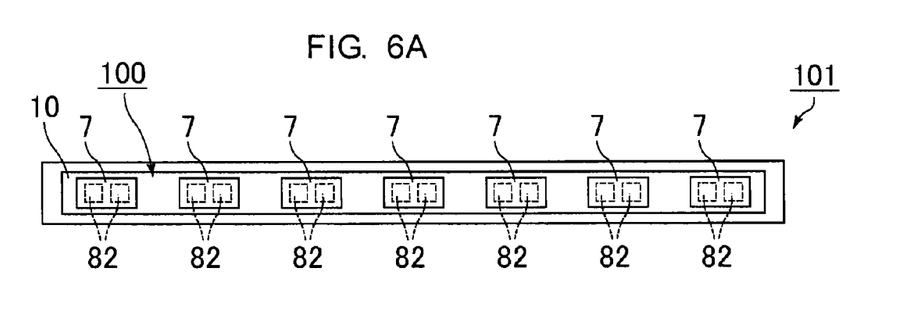
FIGS. 6A-6C are plan views schematically illustrating examples of light-emitting element modules in which a substrate for mounting an electronic component according to an embodiment of the present invention is used.
Figure 6B:
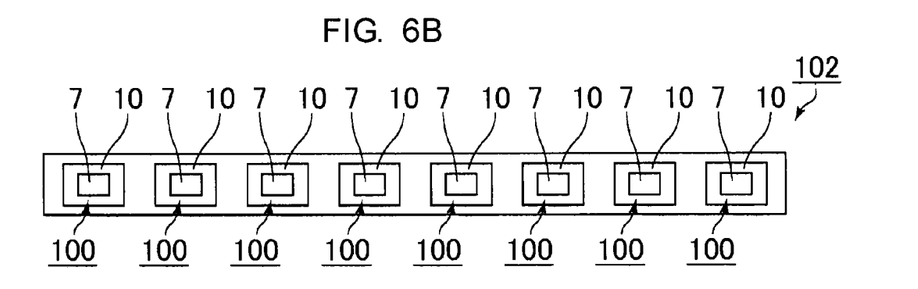
Figure 6C:
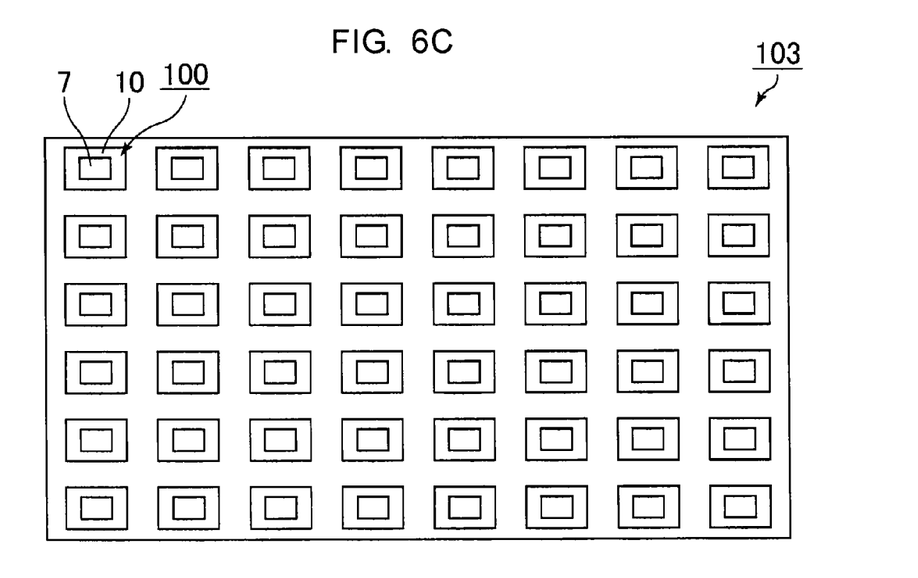

FIGS. 6A-6C are plan views schematically illustrating examples of light-emitting element modules in which a substrate for mounting an electronic component according to an embodiment of the present invention is used.

In a light-emitting element module 101 illustrated in FIG. 6A, multiple element mounting parts (mounting pads that are each formed by forming a gold plating layer 82 on an outermost surface) are formed in the substrate 10 for mounting an electronic component illustrated in FIG. 2. A light-emitting element 7 is mounted on each of the element mounting parts. That is, light-emitting elements 7 are mounted in the light-emitting device 100, and the light-emitting element module 101 includes the light-emitting device 100 in which the light-emitting elements 7 are mounted.

In a light-emitting element module 102 illustrated in FIG. 6B, the light-emitting device 100 is formed by mounting one light-emitting element 7 on the substrate 10 for mounting an electronic component. The light-emitting element module 102 is formed by arraying multiple light-emitting devices 100 in a row, one light-emitting element 7 being mounted on the substrate 10 for mounting an electronic component in each of the light-emitting devices 100.

In a light-emitting element module 103 illustrated in FIG. 6C, multiple light-emitting devices 100 are arrayed in a lattice-like pattern, one light-emitting element 7 being mounted on the substrate 10 for mounting an electronic component in each of the light-emitting devices 100, similar to that illustrated in FIG. 6B.

In this way, by modularizing the light-emitting elements 7 using the substrate 10 for mounting an electronic component, a density of the light-emitting elements 7 can be increased and luminance can be increased.

Among these light-emitting element modules, the light-emitting element module illustrated in FIG. 6A is desirable in which element mounting parts are formed in electronic component mounting substrate and light-emitting elements are mounted on the element mounting parts.

Such light-emitting element modules (101, 102, 103) can each be suitably used, for example, as a backlight unit of a liquid crystal display panel, an illuminating device, and the like.

Next, a method for manufacturing a substrate for mounting an electronic component according to an embodiment of the present invention is described.

A method for manufacturing a substrate for mounting an electronic component according to an embodiment of the present invention is a method for manufacturing a substrate on which an electronic component is mounted. The method includes:

a double-sided conductor substrate preparation process in which a double-sided conductor substrate is prepared by forming a first conductor layer on a first main surface of a base material and forming a second conductor layer on a second main surface of the base material, the base material being formed of an insulating resin and having the first main surface and the second main surface, the second main surface being on an opposite side of the first main surface;

a hole formation process in which a hole that penetrates the first conductor layer, the base material and the second conductor layer is formed by punching from the first conductor layer; and an insert-fitting process in which a metal block is inserted into and fitted to the hole from the second conductor layer side.

In the following, the processes are described using the drawings.

FIGS. 7A-7D are process diagrams schematically illustrating a method for manufacturing a substrate for mounting an electronic component according to an embodiment of the present invention.

(1) Double-Sided Conductor Substrate Preparation Process

Figure 7A:
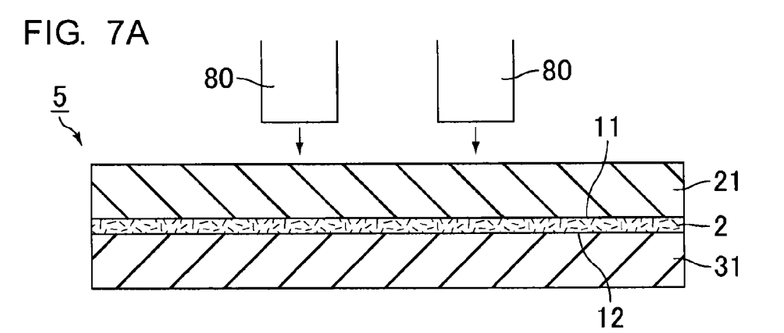
FIGS. 7A-7D are process diagrams schematically illustrating of a method for manufacturing a substrate for mounting an electronic component according to an embodiment of the present invention.

First, as illustrated in FIG. 7A, a double-sided conductor substrate 5 is prepared by forming the first conductor layer 21 on the first main surface 11 of the base material 2 and forming the second conductor layer 31 on the second main surface 12 of the base material 2, the base material 2 being formed from an insulating resin and having the first main surface 11 and the second main surface 12, the second main surface 12 being on an opposite side of the first main surface 11.

The materials that form the base material 2, the first conductor layer 21 and the second conductor layer 31 are the same as those described in the description of the substrate for mounting an electronic component and thus a description thereof is omitted.

(2) Hole Formation Process

Next, a hole that penetrates the first conductor layer 21, the base material 2 and the second conductor layer 31 is formed by punching from the first conductor layer 21. FIG. 7A illustrates a state in which a punch 80 that is used in the punching is positioned on the first conductor layer 21 side.

Figure 7B:
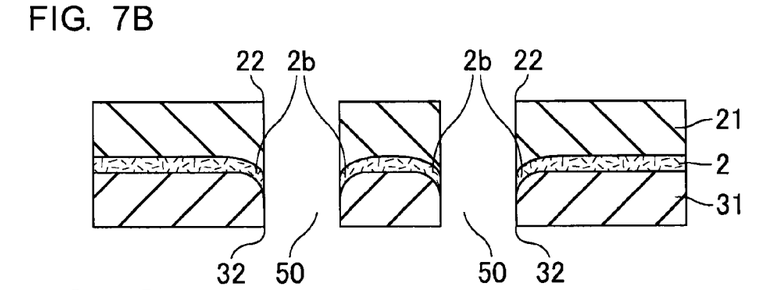

FIG. 7B illustrates the double-sided conductor substrate in which the hole 50 is formed.

In this case, the first fitting inlet 22 is formed on the first conductor layer 21 side and the second fitting inlet 32 is formed on the second conductor layer 31 side.

Due to the punching, the base material 2 bends toward the second conductor layer 31 side and a bent part (2b) is formed.

(3) Insert-Fitting Process

Figure 7C:
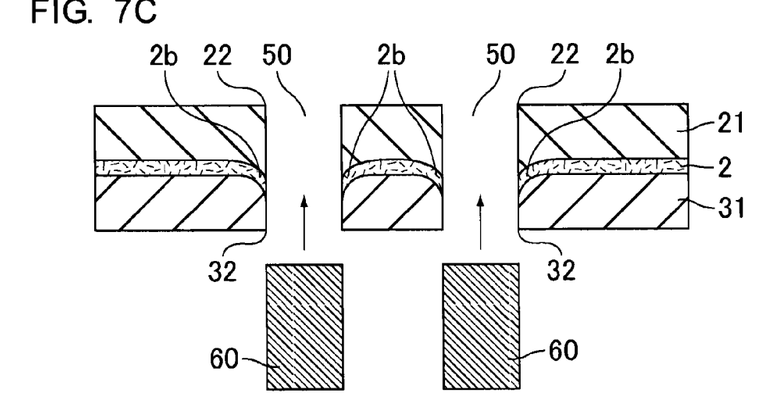

Next, as illustrated in FIG. 7C, the metal block 60 is inserted into and fitted to the hole 50 from the second fitting inlet 32 on the second conductor layer 31 side.

When the metal block 60 is inserted to fit into the hole 50 from the second conductor layer 31 side, the bent part (2b) that bends toward the second conductor layer 31 side is bent toward the first conductor layer 21. As a result, the portion that bends toward the second conductor layer 31 side becomes the bent part (2a) that has a degree of bending less than that of the bent part (2b).

Figure 7D:
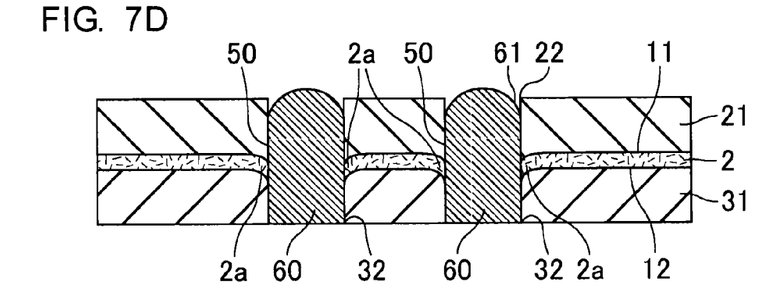

FIG. 7D illustrates the bent part (2a) after the metal block 60 is inserted into and fitted to the hole 50.

The bent part (2a) formed in this way has a shape such that the bending is of a degree that does not interfere with the conduction between the metal block 60 and the second conductor layer 31.

Further, when the metal block 60 is inserted to fit into the hole 50, the outer peripheral portion 61 of the surface of the metal block 60 on the first conductor layer 21 side has a curved-surface shape due to being pulled by a side wall resistance.

Further, the second fitting inlet 32 and the metal block 60 are in a state of being in contact with each other.

A substrate for mounting an electronic component according to an embodiment of the present invention can be manufactured by the above-described processes.

A substrate for mounting an electronic component according to an embodiment of the present invention manufactured by the above-described processes (1)-(3) alone has only the basic structure of a substrate for mounting an electronic component according to an embodiment of the present invention. Therefore, it is preferable that the following processes be further performed.

(4) Pattern Formation Process

Figure 8A:
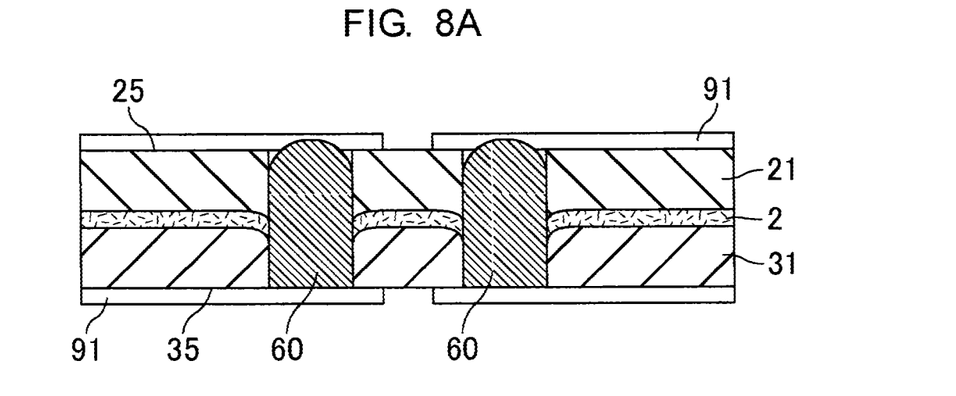
FIGS. 8A-8C schematically illustrate an example of a pattern formation process.
Figure 8B:
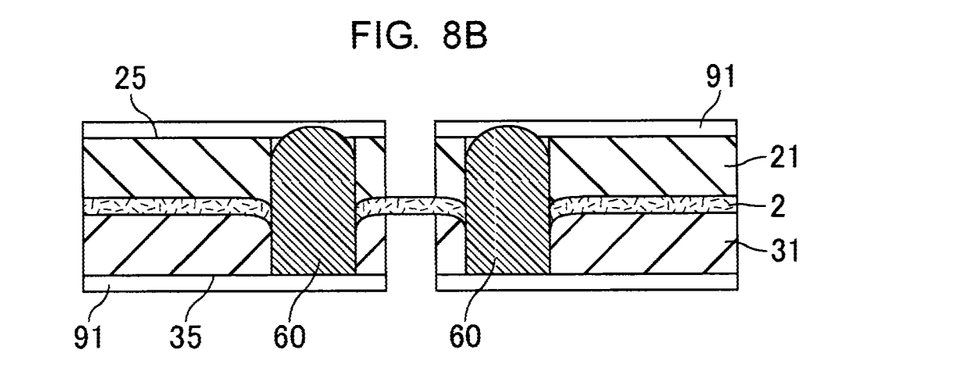
Figure 8C:
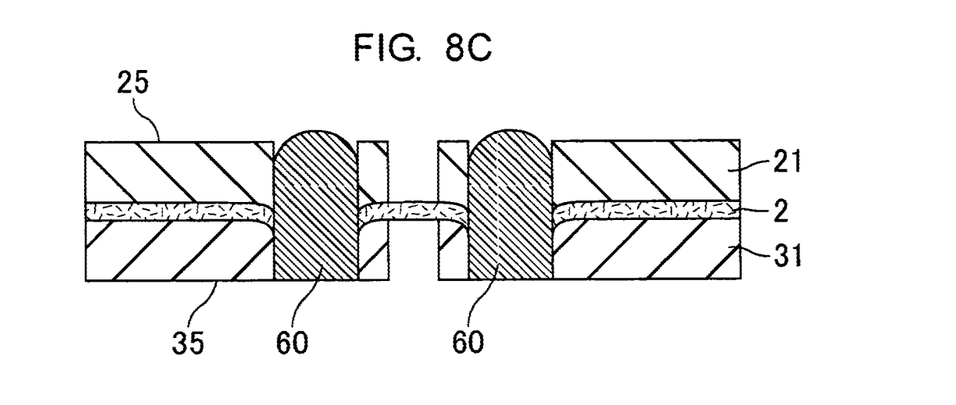

FIGS. 8A-8C schematically illustrate an example of a pattern formation process.

As illustrated in FIG. 8A, an etching resist 91 is formed on the surface 25 of the first conductor layer 21, on the metal block 60, and on the surface 35 of the second conductor layer 31.

Next, as illustrated in FIG. 8B, portions of the first conductor layer 21 and the second conductor layer 31, where the etching resist 91 is not formed, are removed by etching.

Thereafter, as illustrated in FIG. 8C, the etching resist 91 is removed. Any pattern can be formed using such a method.

Examples of an etching solution include an aqueous solution of sulfuric acid and hydrogen, a persulfate aqueous solution such as ammonium persulfate, ferric chloride, cupric chloride, hydrochloric acid, and the like. Further, a mixed solution containing a cupric complex and an organic acid may also be used as the etching solution.

(5) Pressing Process

Figure 9:
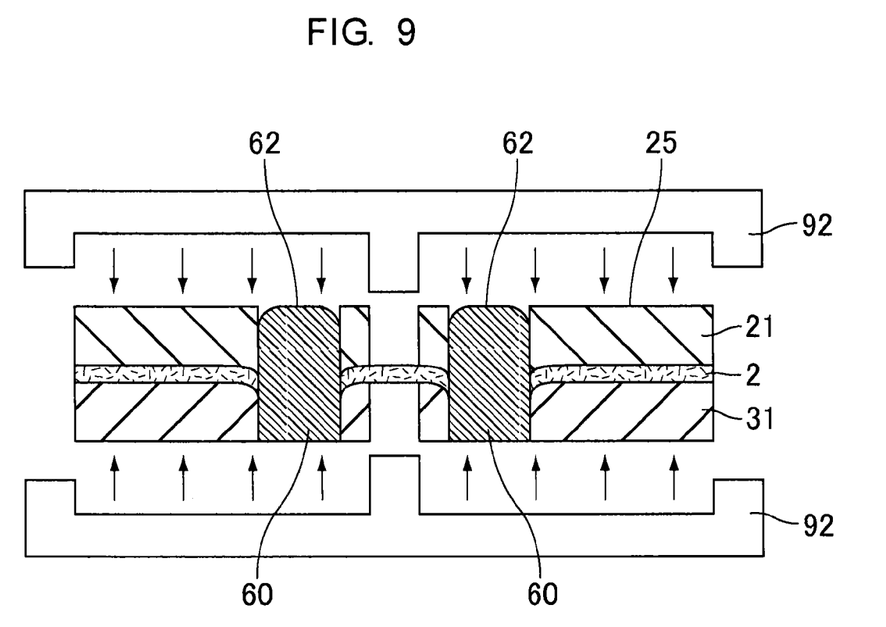
FIG. 9 schematically illustrates a pressing process.

FIG. 9 schematically illustrates a pressing process.

Next, as illustrated in FIG. 9, by press working the substrate for mounting an electronic component using a mold 92 having a predetermined shape, a position of the surface of the metal block 60 relative to the surface 25 of the first conductor layer 21 is controlled.

Further, the front end portion 62 of the surface of the metal block 60 on the first conductor layer 21 side becomes a flat surface.

(6) Coining Process

Next, in order to improve flatness of the surface 25 of the first conductor layer 21 and the surface of the metal block 60 on the first conductor layer 21 side, coining is performed.

When the flatness of the surface 25 of the first conductor layer 21 and the surface of the metal block 60 on the first conductor layer 21 side is improved by coining, mountability of an electronic component can be improved. Further, when the flatness of the surface 25 of the first conductor layer 21 and the surface of the metal block 60 on the first conductor layer 21 side is high, optical axes in the case where light-emitting elements are mounted can be aligned and luminance can be improved.

The substrate for mounting an electronic component manufactured by performing the above-described processes (1)-(6) is the substrate 1 for mounting an electronic component illustrated in FIG. 1.

(7) Metal Plating Process

Figure 10:
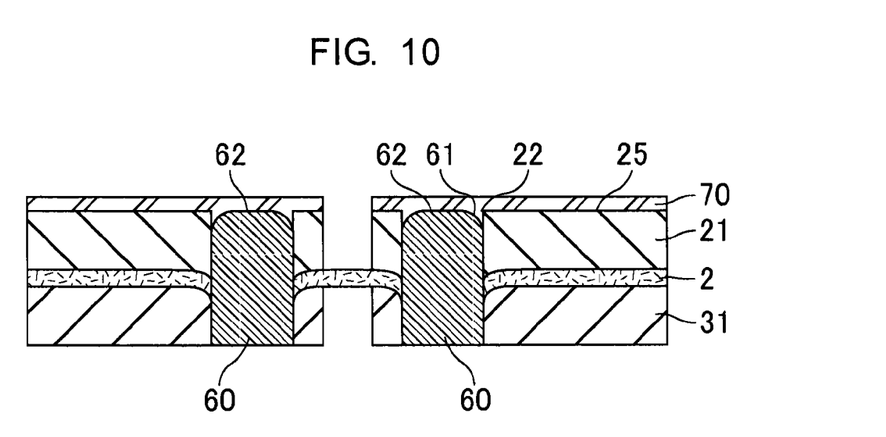
FIG. 10 schematically illustrates a metal plating process.

FIG. 10 schematically illustrates a metal plating process.

Next, as illustrated in FIG. 10, a metal plating process is performed in which the metal plating layer 70 is formed on the surface of the metal block 60 on the first conductor layer 21 side and on the surface 25 of the first conductor layer 21.

When the metal plating layer 70 is formed, the surface of the metal block 60 on the first conductor layer 21 side and the surface 25 of the first conductor layer 21 are protected by the metal plating layer 70, and the metal block 60 and the first conductor layer 21 can be protected from corrosion.

Further, in the metal plating process, it is preferable that the metal plating be performed using at least one metal selected from a group of nickel and silver.

By making the metal plating layer a nickel plating layer, when a gold plating layer is formed in a subsequent process, connectivity between the first conductor layer and the gold plating layer can be improved by the nickel plating layer.

Further, in the metal plating process, it is preferable that the metal plating layer 70 be formed such that the surface of the metal block 60 on the first conductor layer 21 side and the surface 25 of the first conductor layer 21 are covered and that the outer peripheral portion 61 of the surface of the metal block 60 on the first conductor layer 21 side and the first fitting inlet 22 are connected to the surface of the metal block 60 on the first conductor layer 21 side and the surface 25 of the first conductor layer 21.

(8) Gold Plating Process

Figure 11:
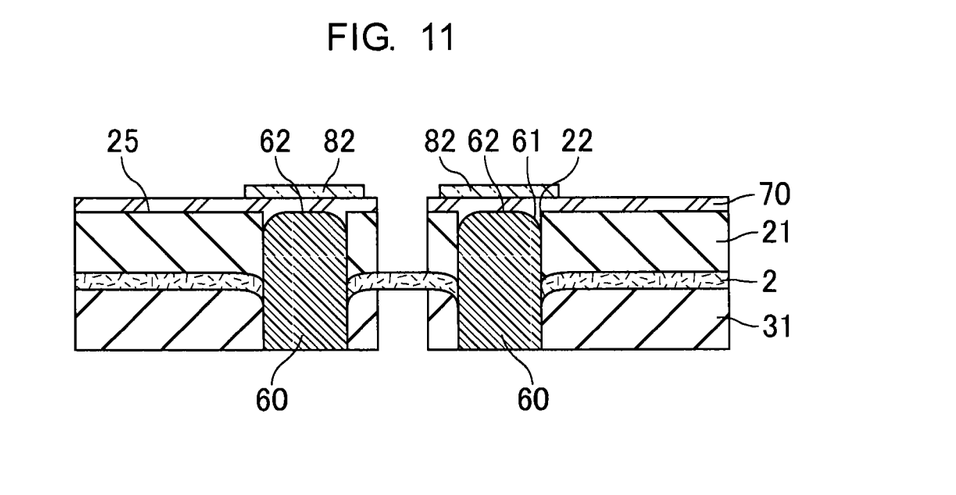
FIG. 11 schematically illustrates a gold plating process.

FIG. 11 schematically illustrates a gold plating process.

Next, the gold plating layer 82 is formed on the metal plating layer 70 on a portion (which becomes a mounting pad) of the front end portion 62 of the surface of the metal block 60 on the first conductor layer 21 side, and thus the mounting pad having the gold layer formed on an outermost surface thereof.

In the case where nickel is used to form the metal plating layer 70 in the metal plating process, an oxide film forms on a surface of the metal plating layer 70, and electrical connection between the mounting pad and an electrode of an electronic component is likely to deteriorate.

Therefore, by forming the gold plating layer on the outermost surface of the mounting pad, connectivity between the mounting pad and the electrode of the electronic component is improved.

Removal of the nickel oxide film can be performed using a commonly-used nickel oxide film removing agent. As the nickel oxide film removing agent, a conventionally known reagent can be used.

Further, it is preferable that the gold plating process be performed using an electroless gold plating solution.

(9) Light-Reflecting Layer Formation Process

Figure 12:
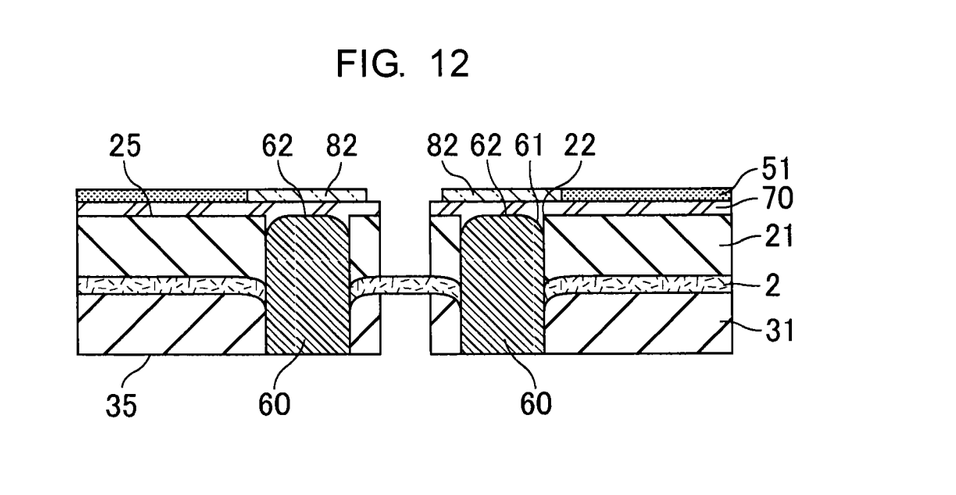
FIG. 12 schematically illustrates a light-reflecting layer formation process.

FIG. 12 schematically illustrates a light-reflecting layer formation process.

Next, as illustrated in FIG. 12, the light-reflecting layer 51 is formed on the outermost surface on the first conductor layer 21 side such that the element mounting part (gold plating layer 82) is exposed.

When the light-reflecting layer 51 is formed, it is desirable that the light-reflecting layer 51 be formed using a material that contains titanium oxide as a pigment and allows the formed light-reflecting layer 51 to be an insulating layer.

Further, it is more desirable that the light-reflecting layer 51 be formed to be a solder resist layer.

Titanium oxide is a white pigment. The light-reflecting layer 51 containing titanium oxide can suitably reflect light.

When the light-reflecting layer 51 is a solder resist layer containing titanium oxide as a pigment, in addition to the above effect, the light-reflecting layer 51 also functions as a solder resist at the same time.

By performing all of the above-described processes (1)-(9), the substrate 10 for mounting an electronic component illustrated in FIG. 2 can be manufactured.

When the substrate 20 for mounting an electronic component illustrated in FIG. 5 is manufactured, a metal block having a length longer than the thickness of the double-sided conductor substrate is used so that, after the insert-fitting process, an end portion of the metal block protrudes from the surface of the second conductor layer. The protruding portion of the metal block becomes the second protruding portion.

The second extending portion is formed by spreading the second protruding portion so as to cover the surrounding area of the second fitting inlet.

The method for forming the second extending portion is not particularly limited. However, it is desirable that the second extending portion be formed by applying a pressure to a top portion of the second protruding portion to spread the second protruding portion.

The metal block has plasticity. Therefore, by applying a pressure to the top portion of the second protruding portion using a mold, the second extending portion can be easily formed.

A light-emitting element such as an LED (light-emitting diode) is used as a backlight unit in a mobile phone or in a liquid crystal television. Such a light-emitting element is used by being mounted on a light-emitting element mounting member.

Examples of such a light-emitting element mounting member include various forms such as that formed by integrating a terminal member by resin mold-molding, that formed by bending and forming a lead frame, and that in which a printed wiring board is used as a base. Among these, in view of heat dissipation, miniaturization, cost and the like, the light-emitting element mounting substrate in which a printed wiring board is used as a base may be desired.

For a high-luminance light-emitting element, luminance may be improved by modularizing LEDs and improving luminance of an LED itself.

In order to improve luminance by modularizing LEDs, the LEDs may be mounted at a high density on a light-emitting element mounting substrate. LEDs generate less heat. However, when LEDs are mounted at a high density as described above, the LEDs can generate heat in an amount that cannot be neglected.

A light-emitting element mounting substrate may be manufactured by punching a base material with conductor layers on both sides to form an insert-fitting hole and further inserting and fitting a metal block into the insert-fitting hole.

When the insert-fitting hole is formed, punching may be performed from the first conductor layer side, and the metal block may be inserted into and fitted to the insert-fitting hole from the first conductor layer side.

FIGS. 13A-13D are process diagrams schematically illustrating a process for manufacturing a light-emitting element mounting substrate by punching from a first conductor layer side and inserting a metal block to fit into an insert-fitting hole from the first conductor layer side.

Figure 13A:
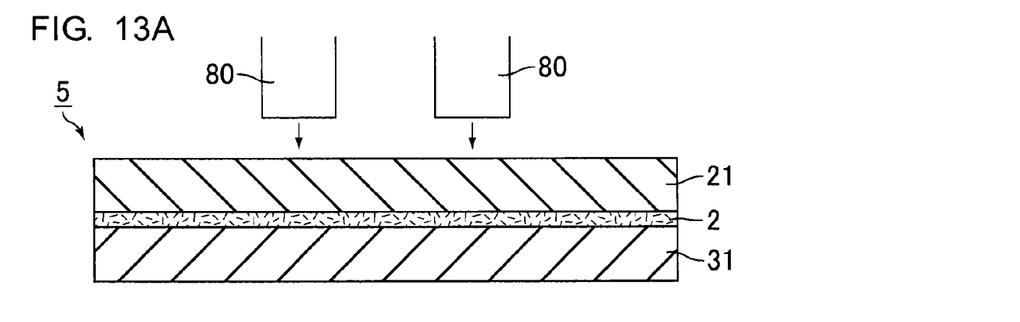
FIGS. 13A-13D are process diagrams schematically illustrating a process for manufacturing a light-emitting element mounting substrate by punching from a first conductor layer side and inserting and fitting a metal block into an insert-fitting hole from the first conductor layer side.

First, as illustrated in FIG. 13A, a double-sided conductor substrate 5 is prepared in which a first conductor layer 21 and a second conductor layer 31 on a base material 2. Next, punching is performed from the first conductor layer 21 side using a punch 80.

Figure 13B:
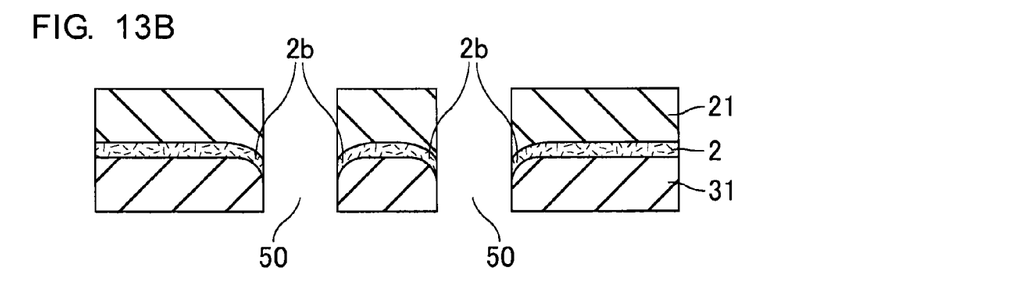

As a result, as illustrated in FIG. 13B, a hole 50 is formed. However, in this case, due to the punching, the base material 2 bends toward the second conductor layer 31 side and a bent part (2b) is formed.

Figure 13C:
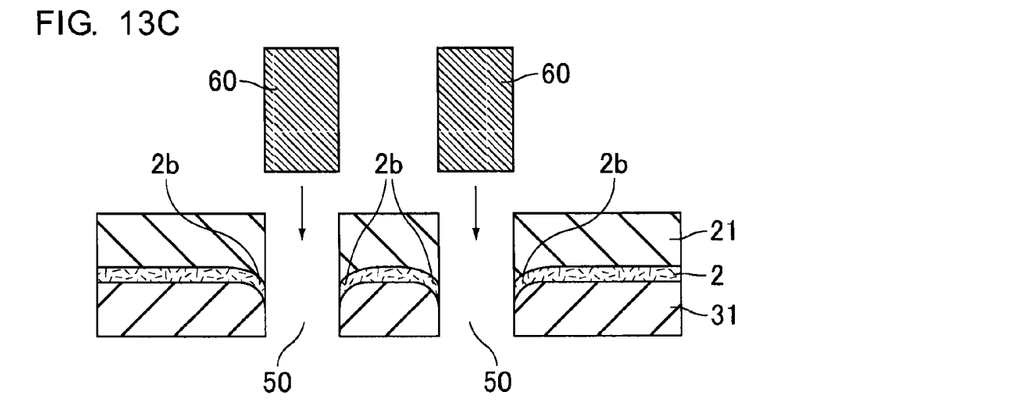
Figure 13D:
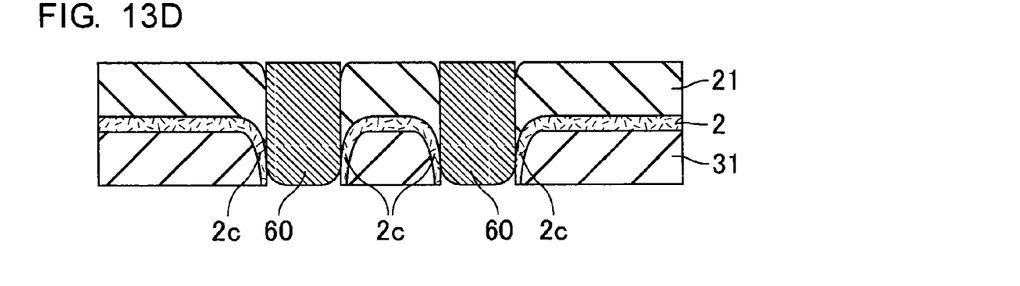

Next, as illustrated in FIG. 13C, when a metal block 60 is inserted to fit into the hole 50 from the first conductor layer 21 side, as illustrated in FIG. 13D, the base material 2 further bends toward the second conductor layer 31 side and a bent part (2c) is formed.

As a result, the base material 2 (the bent part (2c)) reaches a surface of the double-sided conductor substrate 5 on the second conductor layer 31 side and consequently enters between the metal block 60 and the second conductor layer 31, causing a problem that conduction between the metal block and the second conductor layer is interfered with.

A substrate for mounting an electronic component according to an embodiment of the present invention has a metal block inserted to fit into a hole and allows conduction between the metal block and a second conductor layer to be satisfactorily ensured, and according to another embodiment of the present invention is a method for manufacturing such a substrate for mounting an electronic component.

A substrate for mounting an electronic component according to an embodiment of the present invention is a substrate on which an electronic component is mounted.

A substrate for mounting an electronic component according to an embodiment of the present invention includes:

a base material that is formed of an insulating resin and has a first main surface and a second main surface, the second main surface being on an opposite side of the first main surface;

a first conductor layer that is formed on the first main surface of the base material;

a second conductor layer that is formed on the second main surface of the base material;

a hole that penetrates the first conductor layer, the base material and the second conductor layer; and a metal block that is inserted into and fitted to the hole.

The base material has a bent part that bends toward the second conductor layer side and is in contact with the metal block.

An outer peripheral portion of a surface of the metal block on the first conductor layer side is in a curved-surface shape.

The hole has a first fitting inlet on the first conductor layer side and a second fitting inlet on the second conductor layer side. The metal block is in contact with the second fitting inlet.

A substrate for mounting an electronic component according to an embodiment of the present invention has the metal block that penetrates the first conductor layer, the base material and the second conductor layer.

The metal block is different from a filled via that is formed in a through hole through a chemical process such as plating. There are no voids formed inside the metal block. Therefore, heat-transfer efficiency of the metal block is not reduced, and heat dissipation performance of the metal block can be ensured.

In the substrate for mounting an electronic component, although the base material has the bent part that bends toward the second conductor layer side, a degree of the bending is small so that the bent part does not interfere with conduction between the metal block and the second conductor layer.

The metal block is in contact with the second fitting inlet. The second fitting inlet is a part of the hole that penetrates the second conductor layer. Therefore, that the metal block is in contact with the second fitting inlet means that the metal block and the second conductor layer are in contact with each other and conduction between the metal block and the second conductor layer is in a state of being satisfactorily ensured. That is, a substrate for mounting an electronic component according to an embodiment of the present invention is a substrate for mounting an electronic component, in which conduction between the metal block and the second conductor layer is satisfactorily ensured.

Further, the outer peripheral portion of the surface of the metal block on the first conductor layer side is in a curved-surface shape. The outer peripheral portion of the surface of the metal block on the first conductor layer side has such a shape due to being pulled by a side wall resistance when the metal block is inserted to fit into the hole from the second conductor layer side. Since the outer peripheral portion of the surface on the first conductor layer side has the curved-surface shape, a recess can be easily formed on the surface on the first conductor layer side of the substrate for mounting an electronic component by adjusting a plating condition. Therefore, when an electronic component is mounted, even when the electronic component causes lateral displacement, the electronic component is caught by the recess. Therefore, without having a large displacement, conduction between the electronic component and the substrate can be ensured.

In a substrate for mounting an electronic component according to an embodiment of the present invention, it is preferable that the front end portion of the surface of the metal block on the first conductor layer side be a flat surface.

When the front end portion of the surface on the first conductor layer side is a flat surface, an electronic component that is mounted when the front end portion is used as a pad can be prevented from being inclined.

In a substrate for mounting an electronic component according to an embodiment of the present invention, it is preferable that the curved-surface shape be formed in a process in which the metal block is inserted into and fitted to the hole.

In a substrate for mounting an electronic component according to an embodiment of the present invention, a portion of the second conductor layer, where the bent part of the base material is formed, has a thickness, and it is preferable that the thickness of this portion be smaller than a thickness of the other portion of the second conductor layer.

In a substrate for mounting an electronic component according to an embodiment of the present invention, it is preferable that the bent part of the base material be formed by punching. When the bent part is formed by punching, different machinings can also be performed at once and production can be efficiently performed. Further, by laminating the substrate for mounting an electronic component when punching is performed, machining burrs can be controlled.

In a substrate for mounting an electronic component according to an embodiment of the present invention, it is preferable that a front end portion of the metal block on the first conductor layer side be formed on the same plane as the first conductor layer, and a front end portion of the metal block on the second conductor layer side be formed on the same plane as the second conductor layer.

In a substrate for mounting an electronic component according to an embodiment of the present invention, the metal block has a second protruding portion that protrudes from a surface of the second conductor layer.

It is preferable that the second protruding portion have a second extending portion that spreads so as to cover a surrounding area of the second fitting inlet.

When the second extending portion is formed at the site, the second extending portion functions as an anchor that prevents the metal block from being separated and falling out from the substrate 20 for mounting an electronic component. Therefore, when a substrate for mounting an electronic component according to an embodiment of the present invention is bent, the metal block can be prevented from being separated and falling out from the first conductor layer side.

Further, the portion of the second conductor layer where the base material is bent is thin. Therefore, by forming second extending portion on the second conductor layer, the difference between the thickness of the portion other than the bent part of the second conductor layer and the thickness of the bent part of the second conductor layer can be reduced. Therefore, when a current flows, current density distribution in the second conductor layer is small and heat generation is also suppressed.

In a substrate for mounting an electronic component according to an embodiment of the present invention, it is preferable that an element mounting part be formed on the first conductor layer, and a light-reflecting layer be further provided that is formed on an outermost surface on the first conductor layer side such that the element mounting part is exposed.

When a light-emitting element is mounted on a substrate for mounting an electronic component according to an embodiment of the present invention, a light-emitting element may be covered by a transparent cover for a purpose of protecting the light-emitting element. When the light-emitting element emits light, most of the light transmits through the cover. However, a portion of the light is reflected by the cover. In the substrate for mounting an electronic component, when the light-reflecting layer is formed on the outermost surface on the first conductor layer side, the reflected light can be re-reflected.

Therefore, luminance can be increased.

A method for manufacturing a substrate for mounting an electronic component according to an embodiment of the present invention is a method for manufacturing a substrate on which an electronic component is mounted. The method includes:

a double-sided conductor substrate preparation process in which a double-sided conductor substrate is prepared by forming a first conductor layer on a first main surface of a base material and forming a second conductor layer on a second main surface of the base material, the base material being formed of an insulating resin and having the first main surface and the second main surface, the second main surface being on an opposite side of the first main surface;

a hole formation process in which a hole that penetrates the first conductor layer, the base material and the second conductor layer is formed by punching from the first conductor layer; and an insert-fitting process in which a metal block is inserted into and fitted to the hole from the second conductor layer side.

In a method for manufacturing a substrate for mounting an electronic component according to an embodiment of the present invention, the hole is formed by punching from the first conductor layer side, and the metal block is inserted to fit into the hole from the second conductor layer side.

Due to punching, the base material bends toward the second conductor layer side. However, when the metal block is inserted and fitted from the second conductor layer side, the base material is pulled toward the first conductor layer side and returns toward the first conductor layer side. Therefore, when the metal block is inserted to fit, the base material is not further bent toward the second conductor layer side, and a position of the base material becomes closer to a position before punching is performed.

Therefore, a substrate for mounting an electronic component can be manufactured in which the base material is prevented from entering between the metal block and the second conductor layer and conduction between the metal block and the second conductor layer can be satisfactorily ensured.

It is preferable that a method for manufacturing a substrate for mounting an electronic component according to an embodiment of the present invention further include, after the insert-fitting process, a pressing process in which positions of surfaces of the metal block relative to a surface of the first conductor layer and a surface of the second conductor layer are controlled by press working the substrate for mounting an electronic component, in which the metal block has been inserted and fitted, using a mold having a predetermined shape; and a coining process in which flatness of the surface of the first conductor layer is improved.

By press working, the positions of the surfaces of the metal block relative to the surface of the first conductor layer and the surface of the second conductor layer can be controlled.

Further, when the flatness of the surface of the first conductor layer is improved by coining, when this portion is used as a pad, mountability of an electronic component can be improved. Further, when the flatness of the surface of the first conductor layer is high, optical axes in the case where light-emitting elements are mounted can be aligned.

Coining is a method in which a pressure is applied to a portion to cause internal plastic deformation to occur and thereby the flatness of the portion to which the pressure is applied is improved.

Obviously, numerous modifications and variations of the present invention are possible in light of the above teachings. It is therefore to be understood that within the scope of the appended claims, the invention may be practiced otherwise than as specifically described herein.

What is claimed is:

1. A substrate for mounting an electronic component, comprising:
    a base material comprising an insulating resin material;
    a first conductor layer formed on a first surface of the base material;
    a second conductor layer formed on a second surface of the base material on an opposite side with respect to the first surface of the base material; and
    a metal block inserted into a hole penetrating through the first conductor layer, the base material and the second conductor layer such that the metal block is fitted in the hole,
    wherein the base material has a bent portion in contact with the metal block in the hole such that the bent portion is bending toward the second conductor layer, the metal block has a surface on a first conductor layer side such that the surface has an outer peripheral portion having a curved-surface shape, and the hole is formed such that the hole has a first fitting inlet on the first conductor layer side and a second fitting inlet on a second conductor layer side and that the metal block is positioned in contact with the second fitting inlet.

2. The substrate for mounting an electronic component according to claim 1, wherein the metal block is formed such that the surface of the metal block on the first conductor layer side has an end portion having a flat surface.

3. The substrate for mounting an electronic component according to claim 1, wherein the metal block has a first end portion on the first conductor layer side and a second end portion on the second conductor layer side such that the first end portion has a surface on a same plane with respect to a surface of the first conductor layer and that the second end portion has a surface on a same plane with respect to a surface of the second conductor layer.

4. The substrate for mounting an electronic component according to claim 1, wherein the metal block has a protruding portion on the second conductor layer side such that the protruding portion is protruding from a surface of the second conductor layer and has an extending portion spreading out to cover a portion of the surface of the second conductor layer surrounding the second fitting inlet.

5. The substrate for mounting an electronic component according to claim 1, further comprising:
    a component mounting structure formed on the first conductor layer side; and
    a light-reflecting layer formed on the first conductor layer side such that the light-reflecting layer is forming an outermost surface on the first conductor layer side and exposing the component mounting structure.

6. The substrate for mounting an electronic component according to claim 1, wherein the base material has the bent portion bent toward the second conductor layer side at a degree such that the bent portion does not interfere with conduction between the metal block and the second conductor layer.

7. The substrate for mounting an electronic component according to claim 1, wherein the second conductor layer has a portion where the bent portion of the base material is formed such that a thickness of the portion is smaller than thicknesses of remaining portions of the second conductor layer.

8. The substrate for mounting an electronic component according to claim 1, wherein the metal block has a protruding portion on the second conductor layer side such that the protruding portion is protruding from a surface of the second conductor layer and has an extending portion anchoring the metal block to the second conductor layer.

9. The substrate for mounting an electronic component according to claim 2, wherein the metal block has a second end portion on the second conductor layer side such that the end portion has a surface on a same plane with respect to a surface of the first conductor layer and that the second end portion has a surface on a same plane with respect to a surface of the second conductor layer.

10. The substrate for mounting an electronic component according to claim 2, wherein the metal block has a protruding portion on the second conductor layer side such that the protruding portion is protruding from a surface of the second conductor layer and has an extending portion spreading out to cover a portion of the surface of the second conductor layer surrounding the second fitting inlet.

11. The substrate for mounting an electronic component according to claim 2, further comprising:
    a component mounting structure formed on the first conductor layer side; and
    a light-reflecting layer formed on the first conductor layer side such that the light-reflecting layer is forming an outermost surface on the first conductor layer side and exposing the component mounting structure.

12. The substrate for mounting an electronic component according to claim 2, wherein the base material has the bent portion bent toward the second conductor layer side at a degree such that the bent portion does not interfere with conduction between the metal block and the second conductor layer.

13. The substrate for mounting an electronic component according to claim 2, wherein the second conductor layer has a portion where the bent portion of the base material is formed such that a thickness of the portion is smaller than thicknesses of remaining portions of the second conductor layer.

14. The substrate for mounting an electronic component according to claim 12, wherein the metal block has a protruding portion on the second conductor layer side such that the protruding portion is protruding from a surface of the second conductor layer and has an extending portion anchoring the metal block to the second conductor layer.

15. The substrate for mounting an electronic component according to claim 1, wherein the metal block has a first end portion on the first conductor layer side such that the first end portion has a surface on a same plane with respect to a surface of the first conductor layer, and the metal block has a protruding portion on the second conductor layer side such that the protruding portion is protruding from a surface of the second conductor layer and has an extending portion spreading out to cover a portion of the surface of the second conductor layer surrounding the second fitting inlet.

16. A method for manufacturing a substrate for mounting an electronic component, comprising:
   forming a double-sided conductor substrate comprising a base material comprising an insulating resin material, a first conductor layer formed on a first surface of the base material and a second conductor layer formed on a second surface of the base material on an opposite side with respect to the first surface;
   punching a hole from the first conductor layer such that the hole is formed to penetrate through the first conductor layer, the base material and the second conductor layer and that the base material forms a bent portion bending toward the second conductor layer; and
   inserting a metal block into the hole from a second conductor layer side such that the metal block is fitted into the hole and that the bent portion of the base material is positioned in contact with the metal block.

17. The method for manufacturing a substrate for mounting an electronic component according to claim 16, further comprising:
   applying a mold device on a surface of the first conductor layer and a surface of the second conductor layer after the inserting of the metal block such that positions of surfaces of the metal block relative to the surface of the first conductor layer and the surface of the second conductor layer are controlled; and
   applying pressure upon the surface of the first conductor layer such that the surface of the first conductor layer undergoes coning and improves flatness of the surface of the first conductor layer.

18. The method for manufacturing a substrate for mounting an electronic component according to claim 16, wherein the inserting of the metal block comprises inserting the metal block into the hole such that a surface of the metal block on a first conductor layer side forms an outer peripheral portion having a curved-surface shape.

19. The method for manufacturing a substrate for mounting an electronic component according to claim 17, wherein the applying of the molding device comprises controlling the positions of surfaces of the metal block relative to the surface of the first conductor layer and the surface of the second conductor layer such that the metal block has a first end portion on the first conductor layer side and a second end portion on the second conductor layer side, that the first end portion has a surface on a same plane with respect to a surface of the first conductor layer and that the second end portion has a surface on a same plane with respect to a surface of the second conductor layer.

20. The method for manufacturing a substrate for mounting an electronic component according to claim 17, wherein the inserting of the metal block comprises positioning the metal block such that a protruding portion of the metal block protrudes from a surface of the second conductor layer and forms an extending portion spreading out to cover a portion of the surface of the second conductor layer surrounding the second fitting inlet.

* * * * *